United States Patent
Avelar Araujo et al.

(10) Patent No.: US 9,550,953 B2
(45) Date of Patent: Jan. 24, 2017

(54) SLIDING COMPONENT FOR USE IN AN INTERNAL COMBUSTION ENGINE

(71) Applicants: Mahle—Metal Leve S/A, Jundiai (BR); Mahle International GmbH, Stuttgart (DE)

(72) Inventors: Juliano Avelar Araujo, Jundiai (BR); Nuno Costa, Mealhada (PT)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 74 days.

(21) Appl. No.: 14/363,467

(22) PCT Filed: Dec. 7, 2012

(86) PCT No.: PCT/BR2012/000504
§ 371 (c)(1),
(2) Date: Jun. 6, 2014

(87) PCT Pub. No.: WO2013/082688
PCT Pub. Date: Jun. 13, 2013

(65) Prior Publication Data
US 2014/0323368 A1 Oct. 30, 2014

(30) Foreign Application Priority Data
Dec. 7, 2011 (BR) .................................... 1105714

(51) Int. Cl.
*C23C 14/06* (2006.01)
*C10M 103/06* (2006.01)
(Continued)

(52) U.S. Cl.
CPC .......... *C10M 103/06* (2013.01); *C23C 14/024* (2013.01); *C23C 14/0605* (2013.01);
(Continued)

(58) Field of Classification Search
USPC .... 277/942; 204/192, 192.16; 428/216, 336, 428/408, 698
See application file for complete search history.

(56) References Cited

U.S. PATENT DOCUMENTS 6,325,385 B1 * 12/2001 Iwashita .................... F16J 9/26
277/442
6,599,400 B2 * 7/2003 Strondl ................. C23C 14/025
204/192.15

(Continued)

FOREIGN PATENT DOCUMENTS

DE 102008042747 A1 4/2010
DE 102009046281 B3 11/2010
(Continued)

OTHER PUBLICATIONS

English translation of JP 2004-010923.*
English Abstract for JP 2004010923A.

*Primary Examiner* — Archene Turner
(74) *Attorney, Agent, or Firm* — Fishman Stewart PLLC

(57) ABSTRACT

A sliding component for an internal combustion engine may include a ferrous base having a peripheral sliding surface covered with a protective layer including at least one of a nitride applied via physical vapor deposition and a nitrided layer. The base may include a coating of carbon of a diamond-like carbon type. The coating may include at least one of (i) a transition layer including a composition of $WC_{1-X}$ and (ii) a layer of metallic chromium of crystalline structure disposed between the ferrous base and an outer layer of amorphous carbon. The coating may also include an intermediate layer of a nanocrystalline phase of carbides in a multilayer structure having a first sub-layer including a composition different than a second sub-layer disposed under the outer layer.

20 Claims, 3 Drawing Sheets

(51) Int. Cl.
*C23C 14/02* (2006.01)
*C23C 14/32* (2006.01)
*C23C 14/34* (2006.01)
*C23C 30/00* (2006.01)

(52) U.S. Cl.
CPC ...... *C23C 14/0635* (2013.01); *C23C 14/0641* (2013.01); *C23C 14/32* (2013.01); *C23C 14/34* (2013.01); *C23C 30/005* (2013.01); *C10M 2201/041* (2013.01); *C10M 2201/061* (2013.01)

(56) References Cited

U.S. PATENT DOCUMENTS

| | | | |
|---|---|---|---|
| 8,201,831 B2 * | 6/2012 | Hoppe | F16J 9/26 277/440 |
| 2007/0078067 A1 | 4/2007 | Nakagawa et al. | |
| 2011/0268946 A1 | 11/2011 | Fischer et al. | |
| 2012/0205875 A1 | 8/2012 | Kennedy et al. | |
| 2013/0042845 A1 | 2/2013 | Kennedy et al. | |
| 2013/0136861 A1 | 5/2013 | Barenreuter et al. | |

FOREIGN PATENT DOCUMENTS

| | | | |
|---|---|---|---|
| DE | 102008042747 A1 | | 1/2011 |
| DE | 102010002687 A1 | | 9/2011 |
| JP | 2004010923 A | | 1/2004 |
| JP | 2004-169137 | * | 6/2004 |
| JP | 2008-286354 | * | 11/2008 |
| JP | 2009-174009 | * | 8/2009 |

* cited by examiner

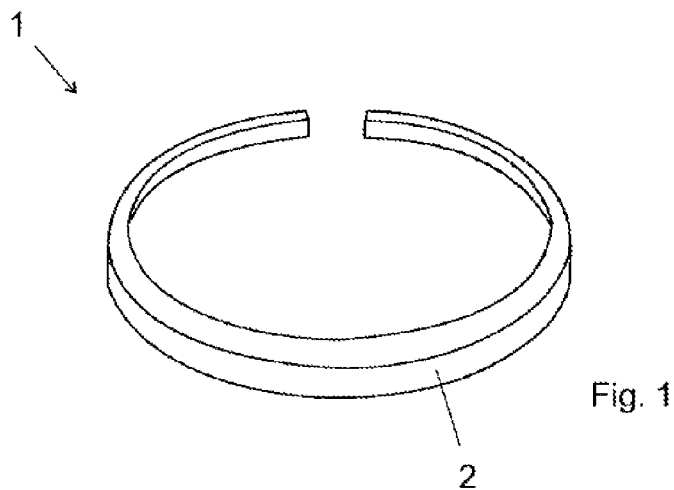
Fig. 1
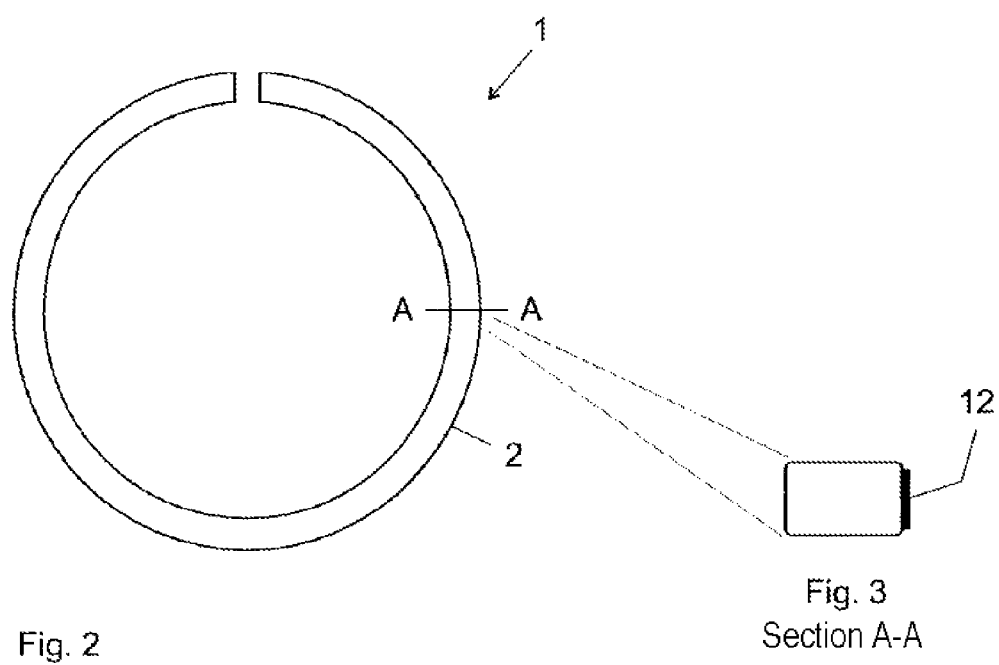
Fig. 2
Fig. 3
Section A-A

SLIDING COMPONENT FOR USE IN AN INTERNAL COMBUSTION ENGINE

CROSS-REFERENCE TO RELATED APPLICATIONS

This application is a US National Phase Application of PCT/BR2012/000504, filed on Dec. 7, 2012, which claims priority to Brazilian Patent Application PI1105714-9, filed on Dec. 7, 2011. The contents of both these applications are hereby incorporated by reference in its entirety.

TECHNICAL FIELD

The present invention relates to a sliding component for use in internal combustion engines, such as for example a piston ring, provided with a coating that comprises at least one transition layer consisting of a ceramic material such as tungsten carbide ($WC_{1-x}$) or the like and/or of a metal such as metallic chromium (bcc-Cr) or some other necessary or desirable equivalent.

The sliding component thus configured offers advantages such as greater stability and durability, endowing the internal combustion engine equipped therewith with a long service life. Recent, exhaustive studies undertaken by the applicant confirmed that the morphology and microstructure of said coating, as well as the innovative deposition process used, which guarantees better adhesion through the combination of the deposition of two combined layers of metallic material in crystalline form with an amorphous structure, result in properties such as greater wear resistance and increase in toughness.

BACKGROUND

For an internal combustion engine to function reliably and according to the ideal parameters specified by its designers, it is necessary for its internal components to have high durability even under the most critical operating conditions. Accordingly, components such as piston rings and bearings, among others, must display resistance and durability against wear resulting from constant sliding, high temperatures and chemical and abrasive attack by products originating from the combustion that takes place inside the cylinders.

In view of this high durability that is required, sliding components such as piston rings and bearings are given coatings to better withstand the endless operating cycles of the engines, and the coatings applied to these components are constantly being refined, with as premises the base material of which the component is composed, the operating parameters of the engine, the costs of manufacture, etc.

Specifically with respect to piston rings, some coatings have been developed for endowing these components with high durability at an advantageous cost of production.

A first coating is disclosed in the case of patent DE 10 2009 046 281, which relates to a piston ring manufactured in steel or cast iron that has a coating consisting of a DLC layer without metal or composed of a metallic inner layer and a nonmetallic top layer, a layer of chromium nitride (CrN) deposited by the PVD process (physical vapor deposition) and a ceramic Me ($C_xN_y$) intermediate layer.

The nitrided layer is applied on the ring base and the aforementioned intermediate layer is applied thereon subsequently. Finally, the coating DLC is applied on the intermediate layer.

Optionally (non-obligatory), an adhesive layer is provided, which forms the bond between the layer of chromium nitride applied by PVD and the base of the piston ring or the like.

A vulnerability of this coating is that the Me($C_xN_y$) bonding layer is fragile and brittle, and can result in premature detachment of the covering, resulting in a shorter service life of the internal combustion engine, which is undesirable in terms of marketing.

Moreover, in contrast to the coating now proposed, this coating of the prior art does not possess a transition layer consisting of tungsten carbide $WC_{1-x}$.

Document DE 10 2008 042 747 discloses a sliding component such as a piston ring, the coating of which comprises an adhesive layer consisting of metallic chromium applied on the substrate, a nitrided layer (CrN) applied by the PVD process (physical vapor deposition), an inner layer provided with carbon that possesses greater hardness and/or contains a small percentage of hydrogen than an outer layer provided with carbon preferably of the type a-C:H.

The disadvantage of this second coating is that hydrogen promotes formation of the $sp^3$ electronic structure (the same structure as diamond) and with reduction of this there will be an increase in $sp^2$ structure (the same structure as graphite). As a result, the wear resistance of this covering is compromised.

Moreover, as a difference relative to the coating now developed, this coating of the prior art has, as a large difference, the second layer, counting from outside inwards, which has the form of amorphous carbon contrary to the innovative multilayer structure (W—C:H) and (a-C:H). Accordingly, the performance indices achieved by this coating are lower, notably in resistance to crack propagation.

Document DE 10 2009 028 504, in its turn, discloses a piston ring manufactured in steel or cast iron covered initially with an adhesive layer, to which an intermediate layer is applied containing carbon and a metal, especially tungsten and a layer of DLC without a metallic component. The average thickness of this coating is from 5 µm to 40 µm, the ratio of the thickness of the outer layer to that of the intermediate layer is from 0.7 to 1.5 and the ratio of the thickness of the outer layer to the total thickness of the coating is from about 0.4 to 0.6.

As a large difference relative to the coating now developed, this prior art does not have an intermediate layer configured as a (W—C:H) and (a-C:H) multilayer structure. In fact, this layer is absent from this coating and, accordingly, the performance indices achieved with it are lower, notably in resistance to crack propagation.

Finally, document US 2007/0078067 discloses a coating applied to at least one sliding part, characterized in that it comprises a film of amorphous carbon on the sliding surface of the component and has a ratio of total intensity in the Raman spectrum of band D (associated with carbon disorder $sp^2$) to band G (monocrystalline graphite) between 1.5 and 2.0.

The coatings discussed above have properties that make them unsatisfactory for use in engine components, since they do not simultaneously display high wear resistance and durability suitable for operation within an internal combustion engine. The applicant has developed another coating, novel and inventive compared to the others, that offers significant advantages such as ease of deposition, excellent mechanical properties and competitive cost of application, high wear resistance and toughness compatible with the requirements of modern engines. The present coating can be applied to any sliding components used in an internal combustion engine such as piston rings, bearings, bushes, sleeves, etc., even though they are iron-based.

SUMMARY

The objective of the present invention is any sliding component for use in an internal combustion engine, provided with a coating of the type DLC whose process of application results in a coating that is innovative, novel and inventive in light of the other coatings known at present and that offers numerous advantages of use, such as ease of deposition, excellent mechanical and structural properties and competitive cost of application.

The objectives of the present invention are achieved with a sliding component for use in internal combustion engines, provided with a ferrous base covered with a protective surface layer consisting of at least one nitride applied by the process of physical vapor deposition (PVD) or a nitrided layer, on whose peripheral sliding surface a coating of carbon of the diamond-like carbon (DLC) type is applied, where the coating comprises at least one transition layer consisting of $WC_{1-x}$ and/or a layer of metallic chromium preferably of crystalline structure (bcc—body-centered cubic) located between the ferrous base and an outer layer of carbon (DLC), and a nanocrystalline phase of carbides, in a multilayer structure (a-C:H:W) and (a-C:H) in the form of an intermediate layer between the transition layer and the outer layer of DLC.

Moreover, the objectives of the present invention are achieved by a sliding component for use in internal combustion engines, provided with a ferrous base, on whose sliding peripheral surface a coating is applied, where the coating comprises, reckoning from the outer portion toward the ferrous base, an outer layer of amorphous carbon of the diamond-like carbon (DLC) type of the (a-C:H) type, a nanocrystalline phase of carbides, in a multilayer structure (a-C:H:W) and (a-C:H) and a transition layer consisting of $WC_{1-x}$, and/or a layer of metallic chromium with crystalline structure (bcc—body-centered cubic) and a protective layer consisting of at least one nitride applied by the process of physical vapor deposition (PVD), where the ratio of total intensity in the Raman spectrum of band D (associated with carbon disorder $sp^2$) to band G (monocrystalline graphite) has values between 0.2 and 1.0.

BRIEF DESCRIPTION OF THE DRAWINGS

The present invention will be described in more detail below, on the basis of an embodiment example shown in the drawings. The figures show:

FIG. 1 is a perspective view of a preferred configuration of the sliding component according to the present invention, in the form of a piston ring.

FIG. 2 is a top view of the piston ring illustrated in FIG. 1.

FIG. 3 is a schematic view of the cross section of the piston ring illustrated in FIG. 2 along section A-A, showing, schematically, the coating applied to its sliding peripheral surface.

DETAILED DESCRIPTION

According to a preferred embodiment and as can be seen from FIG. 1, the present invention relates to a sliding component 1 for use in internal combustion engines, which has a ferrous base 10, on whose sliding peripheral surface 2 a coating 12 of carbon of the diamond-like carbon (DLC) type is applied.

The present coating 12 developed by the present applicant is novel and inventive compared to the others currently existing, as will be explained below, and offers significant advantages such as ease of deposition, excellent mechanical and structural properties and competitive cost of application.

Firstly, it should be noted that, preferably, the sliding component 1 is a piston ring, but it may assume any other necessary or desirable configuration such as for example a bearing, a bush, a sleeve or any other component.

Still as a preliminary, it should be noted that the sliding component 1 according to the present invention possesses the coating applied at least to its sliding peripheral surface 2, but there is nothing to stop the coating being applied additionally to other parts and surfaces of the component.

When component 1 has the preferable constitution of a piston ring, the present coating 12 is applied to the lateral peripheral surface 2, which is that which comes in contact with the wall of the cylinder, relative to which the ring slides as the piston executes its reciprocating motion.

However, there is nothing to stop other parts of the ring, for example the top, bottom and inside surfaces, which rub against the respective ring groove present in the piston, from also receiving the present coating.

Figure 4:
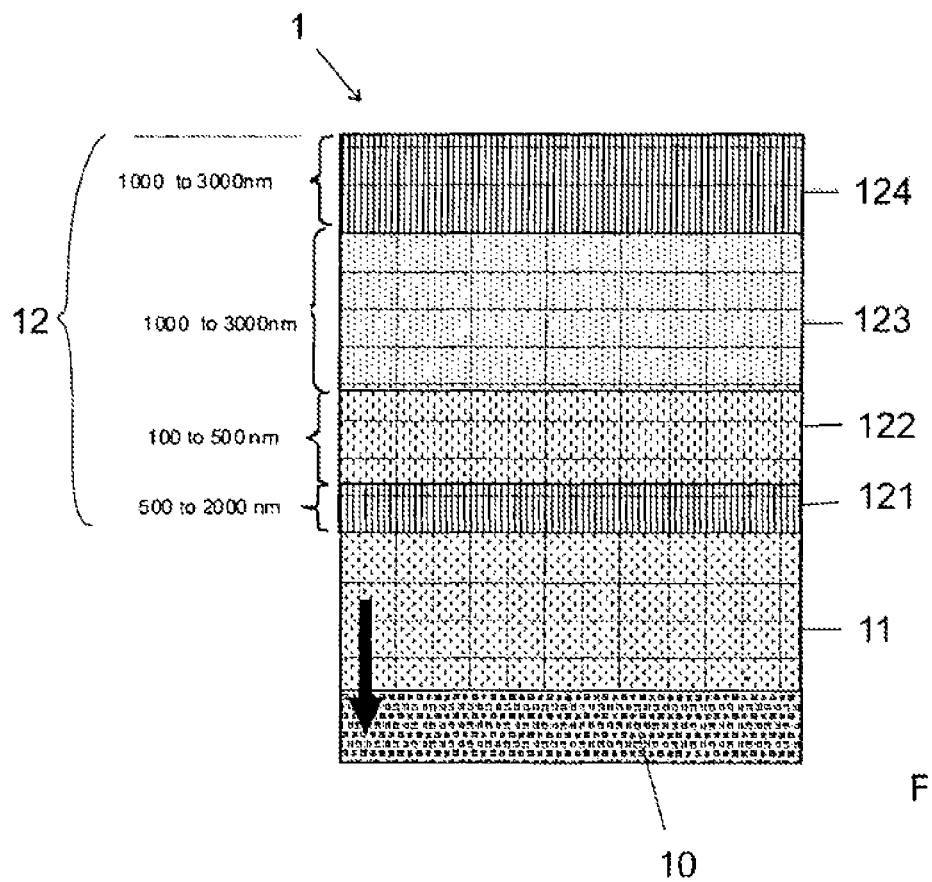
FIG. 4 is a detail view of a preferred variant of the coating applied to the sliding peripheral surface of the sliding component according to the present invention.
Figure 6:
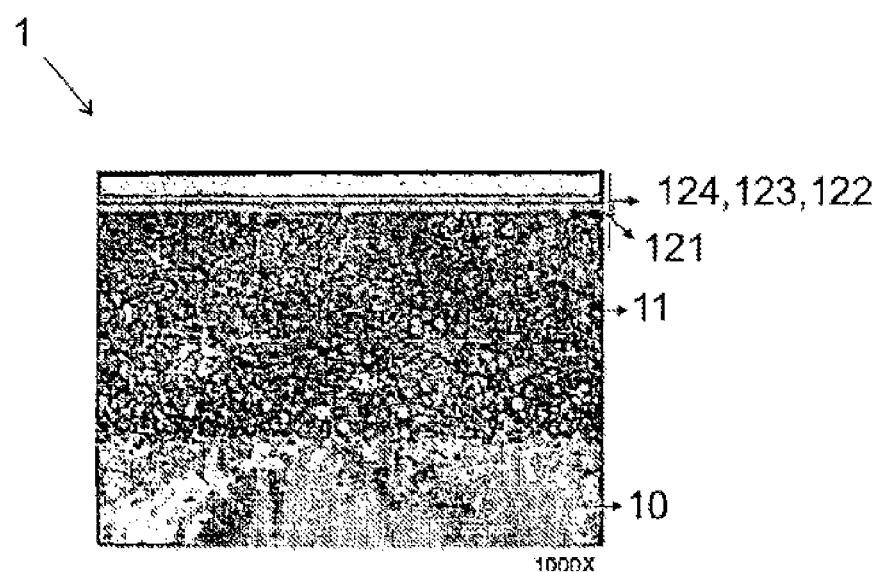
FIG. 6 is a photograph of the coating applied to the sliding peripheral surface of the sliding component according to the present invention at 1000× magnification.

In a conceptual description, the sliding component 1 is provided with a ferrous base 10 covered with a protective surface layer 11 consisting of chromium nitride applied by the process of physical vapor deposition (PVD), also known as ion plating and/or a nitrided layer as is the case presented in FIG. 6. As mentioned above, the sliding peripheral surface 2 is given a coating 12 of carbon of the DLC type, which comprises at least one transition layer 122 consisting of $WC_{1-x}$ and/or a layer of metallic chromium of crystalline structure (bcc—body-centered cubic) 121 located between the ferrous base 10 and an outer layer of amorphous carbon 124. A schematic illustration of the coating, with the layers clearly illustrated, can be seen in FIGS. 3 and 4.

The ferrous base 10 may have the most varied constitutions, but preferably it consists of a substrate of carbon steel, cast iron or else stainless steel (the latter preferably containing 17% of chromium—Cr).

This ferrous base 10 is given the aforementioned protective surface layer 11 consisting of at least one nitride (preferably chromium nitride), by the PVD process. The chromium nitride preferably has the preponderant constitution of CrN but obviously $Cr_2N$ may be used predominantly if necessary or desirable. Moreover, as an alternative, the use of a nitrided layer may be envisaged.

The application of a nitrided layer 11 or covering of CrN by the PVD process on a ferrous substrate 10 is quite well known by persons skilled in the art, and therefore the novelty of coating 12 developed by the applicant resides in the layers applied on the nitrided layer and/or CrN layer.

Thus, beginning the description of the innovative aspects of the present invention, and describing the composition of the layers applied from the base toward the exterior, the nitrided layer is given the coating 12 of carbon of the diamond-like carbon (DLC) type, which comprises the metallic adhesive layer 121, the transition layer consisting of $WC_{1-x}$ 122, the intermediate layer 123 consisting of a nanocrystalline layer of carbides, in a multilayer structure (a-C:H:W) and (a-C:H) and, finally, the outer layer 124 of amorphous carbon of the type (a-C:H).

The metallic adhesive layer 121 is preferably a layer of metallic chromium with the aforementioned crystalline structure (bcc—body-centered cubic). Still preferable, but not obligatory, the thickness of the adhesive layer is from about 500 nm to 2000 nm.

The main function of the adhesive layer 121, as the name suggests, is to increase the adhesiveness of the layers that are deposited thereon in relation to the nitrided layer 11 applied on the ferrous base 10, guaranteeing cohesion of coating 12 as a whole, avoiding spalling and build-up of stresses, phenomena which, if they occur, reduce the useful life of the sliding component 1.

The transition layer 122 consisting of $WC_{1-x}$ is applied on top of the adhesive layer 121 and comprises tungsten carbide (which, in its turn, comprises the chemical elements in variable proportions). The composition $WC_{1-x}$ signifies that, if x=zero, the ratio is one carbon atom (C) to one tungsten atom (W). Similarly, if for example x=0.5, this signifies that there are two tungsten atoms to one carbon atom.

If necessary or desirable, the metal tungsten may be replaced with other metallic elements.

The intermediate layer 123, which as already mentioned consists of a nanocrystalline structure of carbides in a multilayer structure having sublayers (a-C:H:W) and (a-C:H), is applied on top of the transition layer 122, allowing subsequent application of the layer of amorphous carbon 124, of format (a-C:H), which is from the outermost layer of coating 12, the outer layer 124 contains hydrogen.

Figure 5:
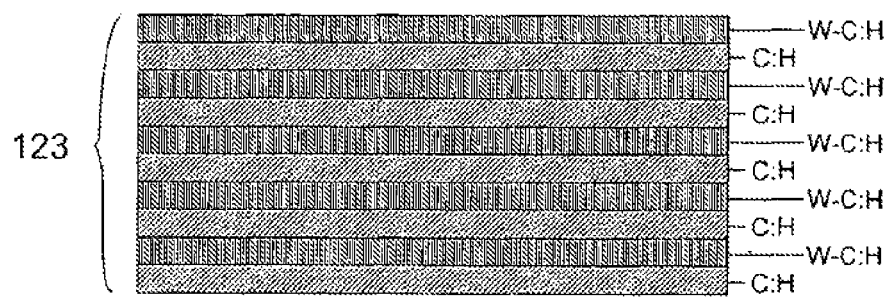
FIG. 5 is a detail view of the intermediate layer consisting of (a-C:H:W) and (a-C:H) of the coating applied to the sliding peripheral surface of the sliding component according to the present invention.

The sublayers (a-C:H:W) and (a-C:H) are applied on top of one another, starting from manipulation of the amount of tungsten present at the moment of application, in the actual equipment in which it is carried out, forming the aforementioned multilayer structure as illustrated in FIG. 5. Such a constitution is clearly advantageous if compared with the existing coatings, in that the intermediate layer is not configured as multilayered, since this multiple structure reduces crack propagation enormously. Even if there is the beginning of a crack or fracture in one of the sublayers (a-C:H:W) or (a-C:H), its growth or propagation is interrupted at the instant that it reaches the immediately adjacent sublayer, due to the fact it has a structure that is sufficiently different in terms of dissipation/build-up of stresses.

This characteristic displayed by the intermediate layer 123 of the coating according to the present invention, of preventing crack propagation, means that the sliding engine component according to the present invention has greater wear resistance, and consequently the engine is given a longer useful life, and so is much more desirable.

The preferred thicknesses of the layers of the coating 12 according to the present invention are given in the following table, but the thicknesses may vary freely while the resultant invention remains within the scope of protection of the claims.

| | |
|---|---|
| Outer layer 124 | 1000 nm to 3000 nm |
| Intermediate layer 123 (multilayer) | 1000 nm to 3000 nm |
| Transition layer 122 | 100 nm to 500 nm |
| Adhesive layer 121 | 500 nm to 2000 nm |

Besides possessing a configuration not presented by any relevant coating of the prior art, coating 12 has a number of very desirable technical characteristics and properties.

In some of the most recent of the assiduous studies that the applicant undertakes to remain in the vanguard of technology, he discovered that the morphology and microstructure of the present coating 12, as well as the process for deposition of the aforementioned layers that guarantees greater adhesion based on addition of two combined layers of metallic crystalline material (tungsten—W), in combination with the amorphous structure of the outer layer 124, mean that the present coating 12 has lower rates of wear and an increase in toughness, properties that are extremely desirable for use in sliding components of engines.

Although the increase in hardness could be achieved on the basis of grain refinement and control of the levels of tungsten present, even reaching the level displayed by ceramic components, it was possible to obtain increased hardness while maintaining reasonable elasticity, or toughness, and avoiding the typical defects displayed by coatings of the DLC type with large thicknesses.

The present coating 12 is a very efficient alternative to a multilayer film with nanocrystalline structure because, contrary to the others that exist, it is tough enough to give good results according to two different approaches.

In a first approach, due to the combination of resilience and toughness that are more compatible with those displayed by the base material (ferrous substrate), it is quite a lot more tolerant to wear compared to other coatings based on carbon.

In a second approach, the nanocrystalline structure acts as a stress-relieving element and makes protection possible that is compatible with the coating of the engine component relative to which component 1 with the present coating 12 slides.

The hardness of coating 12 is from 1500 HV to 2000 HV.

It is also important to mention that, in coating 12 according to the present invention, the ratio of total intensity in the Raman spectrum of band D (associated with carbon disorder $sp^2$) to band G (monocrystalline graphite) has values between 0.2 and 1.0, which will be discussed in detail later.

Raman spectroscopy is a technique that uses a monochromatic light source which, on reaching an object, is scattered by it, generating light of the same energy or of different energy relative to the incident light. In the first case, the scattering is called elastic and is not of interest, but in the second case (inelastic scattering) it is possible to obtain a lot of important information on the chemical composition of the object from this energy difference. The technique is possible owing to the phenomenon by which, when a molecule is irradiated, the energy can be transmitted, absorbed, or scattered.

The Raman effect can be explained by the inelastic collision between the incident photon and the molecule. This changes the levels of the vibrational and/or rotational energies of the molecule by a given increment and, by the law of conservation of energy, this means that the energies of the incident and scattered photons will be different.

The Raman spectrum is the wavelength of the scattered radiation relative to the excitation radiation (laser). The readings are taken in the visible region and the NIR (near infrared).

Explaining in greater detail, a beam of low-power laser radiation is used for illuminating small areas of the object of interest and, on impinging on the area defined, it is scattered in all directions, a small packet of this radiation being scattered inelastically (with frequency different from the incident frequency→E=hv or E=h.c.λ−1).

The energy difference between the incident radiation and the scattered radiation corresponds to the energy with which the atoms present in the area investigated are vibrating and this vibration frequency makes it possible to detect how the atoms are joined together, to provide information on molecular geometry, on how the chemical species present interact with one another and with the environment, among other things.

Moreover, the technique of Raman spectroscopy allows differentiation of polymorphs, i.e. substances that have different structures and therefore different properties, despite having the same chemical formula.

As there is not only one type of vibration, since generally the chemical species present are complex, the radiation scattered inelastically consists of a very large number of different frequencies that must be separated to obtain the measured intensity. The graph showing the intensity of the scattered radiation as a function of its energy (given in a unit called wavenumber and expressed in $cm^{-1}$) is called the Raman spectrum. Each chemical species, whether a pigment, colorant, substrate, agglutinant, vehicle or varnish, supplies a spectrum which is, as it were, its fingerprint, allowing unambiguous identification or, for example, detection of chemical changes arising from its interaction with other substances or with light.

Returning to the present coating, analysis of the Raman spectrum makes it possible to define the bands D and G (carbon disorder $sp^2$ and monocrystalline graphite, respectively).

The Raman spectra of the various forms of carbon are well known. The first-order spectrum of diamond consists of a single peak at 1332 $cm^{-1}$. The corresponding spectrum of monocrystalline graphite also has a single peak (peak G), at 1580 $cm^{-1}$ (associated with graphitic carbon $sp^2$). In polycrystalline graphite, besides peak G, the Raman spectrum has another peak near 1350 $cm^{-1}$ (peak D) (associated with carbon disorder $sp^2$).

Thus, by comparing the Raman spectrum of polycrystalline graphite with those obtained for the films of DLC, it is possible to investigate the changes in structure of the graphite caused by the presence of metallic elements in the films.

The intensity ratio (ratio) between bands D and G (D/G) indicates the proportion of amorphous structure (outer layer 124) contained in the DLC coating. When the value of this ratio is higher (higher proportion of the amorphous layer), the amorphous structure tends to be transformed to graphite at the moment of sliding, which reduces the coefficient of friction and the resultant wear, but the wear resistance cannot be maintained owing to the points of weakness that exist.

In the case of the present coating 12, the nanocrystalline structure of tungsten carbide is suitable for coatings of amorphous carbon that have a D/G ratio between 0.2 and 1.0 according to the analysis of the Raman spectrum, so that the characteristics of low friction and wear resistance can be improved.

When the D/G ratio is below 0.55, the coefficient of friction cannot be reduced sufficiently, whereas when D/G is above 0.65, the wear resistance can no longer be maintained at interesting levels.

A preferred embodiment example has been described, but it must be understood that the scope of the present invention comprises other possible variations, and is only limited by the content of the appended claims, including possible equivalents.

The invention claimed is:

1. A sliding component for an internal combustion engine, comprising: a ferrous base having a peripheral sliding surface covered with a protective surface layer including at least one of a nitride applied via physical vapor deposition and a nitrided layer, the base including a coating of carbon of a diamond-like carbon type, wherein the coating comprises an outer layer of amorphous carbon, at least one of (i) a transition layer including a composition of $WC_{1-x}$ and (ii) a layer of metallic chromium of crystalline structure disposed between the ferrous base and the outer layer, and an intermediate layer of a nanocrystalline phase of carbides in a multilayer structure having a first sub-layer including a composition different than a second sub-layer disposed under the outer layer;

wherein at least the outer layer of amorphous carbon has a ratio of total intensity in a Raman spectrum of band D to band G of 0.2 to 1.0.

2. The sliding component according to claim 1, wherein the outer layer of carbon includes hydrogen.

3. The sliding component according to claim 1, wherein the transition layer includes nanocrystalline precipitates of tungsten carbide.

4. The sliding component according to claim 1, wherein at least one of the transition layer, the layer of metallic chromium, the intermediate layer and the outer layer is completely amorphous.

5. The sliding component according to claim 1, wherein the transition layer includes a thickness between 100 nm and 500 nm.

6. The sliding component according to claim 1, wherein the coating has an aggregate thickness of 1 μm to 5 μm.

7. The sliding component according to claim 1, wherein the hardness of the coating is between 1500 HV to 2000 HV.

8. The sliding component according to claim 1, wherein the first sub-layer of the intermediate layer includes a composition of a-C:H:W and the second sub-layer includes a composition of a-C:H.

9. The sliding component according to claim 1, wherein the ratio of total intensity in the Raman spectrum of band D to band G has values between 0.55 to 0.65.

10. A sliding component of an internal combustion engine, comprising:
a ferrous base having a sliding surface covered with a protective layer including at least one nitride, the sliding surface having a coating of a diamond-like carbon, the coating including:
an outer layer of amorphous carbon;
an intermediate layer of a nanocrystalline phase of carbides in a multilayer structure having a first sub-layer having a composition of a-C:H:W and a second sub-layer having a composition of a-C:H; and
at least one of (i) a transition layer including a composition of $WC_{1-x}$ and (ii) a layer of metallic chromium of crystalline structure disposed on the protective layer;
wherein the coating has a ratio of total intensity value in Raman spectrum of band D to band G between 0.2 and 1.0.

11. The sliding component according to claim 10, wherein the outer layer of carbon includes hydrogen.

12. The sliding component according to claim 10, wherein the transition layer includes nanocrystalline precipitates of tungsten carbide.

13. The sliding component according to claim 10, wherein at least one of the transition layer, the layer of metallic chromium, the intermediate layer and the outer layer is completely amorphous.

14. The sliding component according to claim 10, wherein the transition layer has a thickness between 100 nm and 500 nm.

15. The sliding component according to claim 10, wherein the ratio of total intensity in the Raman spectrum of band D to band G has values between 0.55 to 0.65.

16. The sliding component according to claim 10, wherein the ferrous base includes is a piston ring.

17. A method of forming a sliding component surface, comprising:

providing a ferrous basing having a peripheral sliding surface;

nitriding the sliding surface with at least one nitride to form a protective layer;

applying at least one of (i) an adhesive layer of metallic chromium of crystalline structure and (ii) a transition layer including a composition of $WC_{1-x}$ to the protective layer;

depositing an intermediate layer on the at least one adhesive layer and transition layer, the intermediate layer including a nanocrystalline structure of carbides in a multilayer structure having sublayers including a composition of a-C:H:W and a-C:H; and overlaying an outer layer of amorphous carbon having a composition of a-C:H on the intermediate layer;

wherein at least the outer layer includes a wavelength intensity ratio value in Raman spectrum of band D to band G between 0.2 and 1.0.

18. The method according to claim 17, wherein the transition layer includes nanocrystalline precipitates of tungsten carbide.

19. The method according to claim 17, wherein applying the transition layer is performed via a sputtering process and the transition layer includes a thickness between 100 nm and 500 nm.

20. The method according to claim 17, wherein the ratio of total intensity in the Raman spectrum of band D to band G has values between 0.55 to 0.65.

\* \* \* \* \*